United States Patent [19]

Blouke et al.

[11] Patent Number: 5,444,280
[45] Date of Patent: Aug. 22, 1995

[54] PHOTODETECTOR COMPRISING AVALANCHE PHOTOSENSING LAYER AND INTERLINE CCD READOUT LAYER

[75] Inventors: Morley M. Blouke, Portland; Geoffrey B. Rhoads, West Linn, both of Oreg.

[73] Assignees: Scientific Imaging Technologies, Inc., Beaverton; Pinecone Imaging Corporation, West Linn, both of Oreg.

[21] Appl. No.: 171,562

[22] Filed: Dec. 20, 1993

[51] Int. Cl.⁶ .................. H01L 29/78; H01L 27/14; H01L 31/00
[52] U.S. Cl. ..................... 257/226; 257/231; 257/233; 257/249; 257/438; 257/444; 257/448; 257/459
[58] Field of Search .............. 257/226, 231, 233, 249, 257/438, 444, 448, 459

[56] References Cited

U.S. PATENT DOCUMENTS

| | | |
|---|---|---|
| 4,629,295 | 12/1986 | Vogl . |
| 4,663,656 | 5/1987 | Elabd et al. . |
| 4,691,253 | 9/1987 | Silver . |
| 4,704,632 | 11/1987 | Van Den Heuvel . |
| 4,827,346 | 5/1989 | Hicks, Jr. . |
| 4,851,914 | 7/1989 | Pfanhouser et al. . |
| 4,868,855 | 9/1989 | Boudewijns et al. . |
| 4,875,100 | 10/1989 | Yonemoto et al. . |
| 4,933,731 | 6/1990 | Kimurh ........................ 257/292 |
| 5,021,854 | 6/1991 | Huth ............................ 257/438 |
| 5,065,029 | 11/1991 | Krivanek . |
| 5,138,458 | 8/1992 | Nagasaki et al. . |
| 5,162,885 | 11/1992 | Hunt et al. ................... 257/245 |
| 5,168,528 | 12/1992 | Field, Jr. . |
| 5,182,647 | 1/1993 | Chang . |
| 5,216,250 | 6/1993 | Pellegrino et al. . |
| 5,221,964 | 5/1993 | Chamberlain et al. . |
| 5,251,037 | 10/1993 | Busenberg . |
| 5,262,867 | 11/1993 | Kojima . |

OTHER PUBLICATIONS

Jaroslav Hynecek, "CCM-A New Low-Noise Charge Carrier Multiplier Suitable for Detection of Charge in Small Pixel CCD Image Sensors," pp. 1972–1975, IEEE Yransactions on Electron Devices, vol. 39, No. 8, Aug. 1992.

Hiroyoshi Komobuchi and Takao Ando, "A Novel High-Gain Image Sensor Cell Based on Si p-n APD in Charge Storage Mode Operation," pp. 1861–1868, IEEE Transactions on Electron Devices, vol. 37, No. 8, Aug. 1990.

Primary Examiner—Ngan J. Ngo
Attorney, Agent, or Firm—Smith-Hill and Bedell

[57] ABSTRACT

The disclosed device and system enables the cell-based amplification of photo-e The disclop41 The detection device is realized by overlaying an amplifying semiconductor structure, generally referred to as avalanche photo-diodes, on top of a typical prior-art charge coupled device structure. The disclosed arrangement is a hybrid of these two technologies with certain provisions which allow the two prior art technologies to function properly as a single integrated unit.

12 Claims, 4 Drawing Sheets

PHOTODETECTOR COMPRISING AVALANCHE PHOTOSENSING LAYER AND INTERLINE CCD READOUT LAYER

FIELD OF THE INVENTION

The present invention relates to the array-based detection of light, also known as electronic imaging, and more particularly relates to devices and systems which can effectively measure very low flux levels of light, also known as spatially resolved photon counting.

BACKGROUND AND SUMMARY OF THE INVENTION

The invention of photographic film in the last century began the process of recording a spatial light distribution, generally with the end goal of forming an "image" of an external "object." It was soon recognized that only a small fraction of light incident upon film was actually being converted into a useful exposure. This concept was ultimately embodied by the term sensitivity.

The advent of electronic means of forming images, first realized by scanned photo-electric converters, then by scanning tubes, and most recently by charge coupled devices and similar wafer-scale devices, offered a multitude of improvements to the photographic film process, the improvement of sensitivity being among them, especially in the case of charge coupled devices.

An ideal array-based detector is one which can determine the exact arrival time, the exact detection location, and the exact wavelength of each and every photon which falls upon a detection device. This ideal is generally far from being realized, and indeed, is not actually required for a vast majority of applications. But proximities to this ideal are helpful for many applications.

One such area is precisely the improvement of sensitivity, especially in relation to the natural noise processes of light detection and measurement. Scientific grade charge coupled devices, intensified cameras, and photon counting cameras are three rather fuzzily defined classes of instruments which attempt to accurately measure lower and lower counts of photons (dimmer and dimmer objects), relative to natural and instrumental noise sources. Scientific grade CCDs generally approach this goal by lowering the "read-noise" of collected photo-charge, where generally a single sensed photon gives rise to a single photo-electron. Even in the best of devices, however, the read noise is quite appreciable relative to distinguishing a single photon event.

Intensified cameras and so-called photon counting devices generally effect an amplification of a single photo-electron into a multitude, or "gain," in electrons, thereby lowering the effective read noise of a device by the very fact of amplifying the signal. Though this approach has proven quite valuable in many applications, it does have its drawbacks, such as cost, lowered quantum efficiency, limited dynamic range and reliability, among others. In photon-counting devices, cost and complexity remain a problem, and devices are often limited in the number of photons per second that can be reliably measured (dynamic range), along with decreases in quantum efficiency, i.e., sensitivity. All prior art devices of these two classes known to the present inventors involve a "staged" approach toward amplification, generally consisting of a detector separate from the amplification mechanism.

Avalanche photo-diode devices have evolved as single channel detectors (i.e. non-array based detectors) in order to integrate onto a single semi-conductor device the process of electron amplification AND signal reading or measurement. Recently, design ideas and certain device realizations have been published which outline basic wafer scale integrations of avalanche semi-conductor principles with prior art array detector principles. See, for example, Komobuchi, et al, "A Novel High-Gain Image Sensor Cell Based on Si p-n APD in Charge Storage Mode Operation," IEEE Trans. on Electron Devices, 37:8, August, 1990, pp. 1861–1868, and Hynecek, "CCM—A New Low-Noise Charge Carrier Multiplier Suitable for Detection of Charge in Small Pixel CCD Image Sensors," IEEE Trans. on Electron Devices, 39:8, August, 1992, pp. 1972–1975. A common characteristic of these prior arts and that of the hereafter disclosed invention is that a single photoelectron is effectively amplified into a (generally selectable) multitude of electrons in the device domain (pre-output amplified) through the process of the avalanche photodiode. There are vast differences, however, in the implementation of this basic idea between that suggested by the published literature and that of the present invention.

One embodiment of the present invention contemplates the separate fabrication of an avalanche photodiode array and a conventional charge coupled device, and their subsequent alignment and fusing into a single wafer scale device. Certain basic modifications to each prior art technology must be made in order to ensure that the fabricated devices are not merely laboratory curiosities, but are capable of true commercial quality and yield. The inventors refer to this as wafer-scale integration of photo-electron amplification and detection, in distinction to "staged" separate elements as in prior art intensified cameras usually characterized by the use of multi-channel plates, and in distinction to the miniaturized "packing" of prior art avalanche photodiodes either in storage mode or in direct X-Y addressable read out schemes.

Many potential advantages fall out from such an arrangement, including cost, high quantum efficiency, variable on-chip gain, improved thermal noise characteristics, among many others. Component devices can be independently tested prior to fusing, increasing overall yields. Likewise, the "division of labor" between photo-sensing and photoelectron transport can be effected, allowing for independent optimization of these two distinct functions. This alone can help increase individual yield of the two constituent devices. As with some of the prior art, the amplifying process is entirely at the wafer scale and uses the inherently low noise process of avalanche photo-diodes. The separate fabrication of the sensing stage allows for the use of prior art backside thinning processes, which is critical for achieving very high quantum efficiencies across a broad range of wavelengths. The use of the CCD readout mechanism ensures optimal noise performance, reducing demands on the required gain in the avalanche stage, which ultimately improves the statistics of "true counts" versus "false counts," improves the dynamic range, and brings us several steps closer to pure shot-noise-limited detectors. Finally and quite importantly, normal engineering evolution of these devices will migrate toward smaller and smaller pixel sizes, which, when combined with their potential for low cost fabrication, lend themselves to the current drive toward electronic detectors for HDTV, electronic cinema, radiology and high definition photography. For these types of applications, the mere presence of low inherent noise gain is sufficient advantage and they generally have no use for the concept of 'photon counting.'

The foregoing and additional features and advantages of the present invention will be more readily apparent from the following detailed description thereof, which proceeds with reference to the accompanying drawings.

DETAILED DESCRIPTION

Summary

Figure 2A:
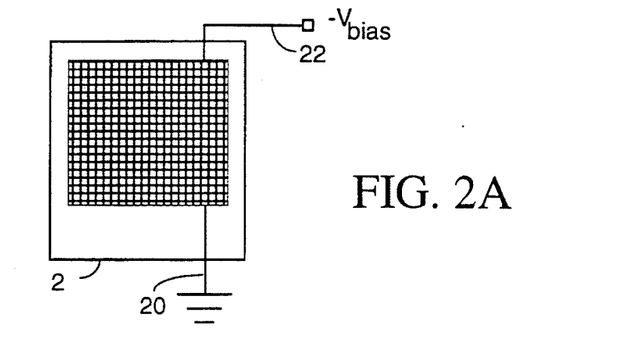
FIG. 2A is a general overview diagram of the avalanche device 2, the upper layer relative to incoming light.
Figure 2B:
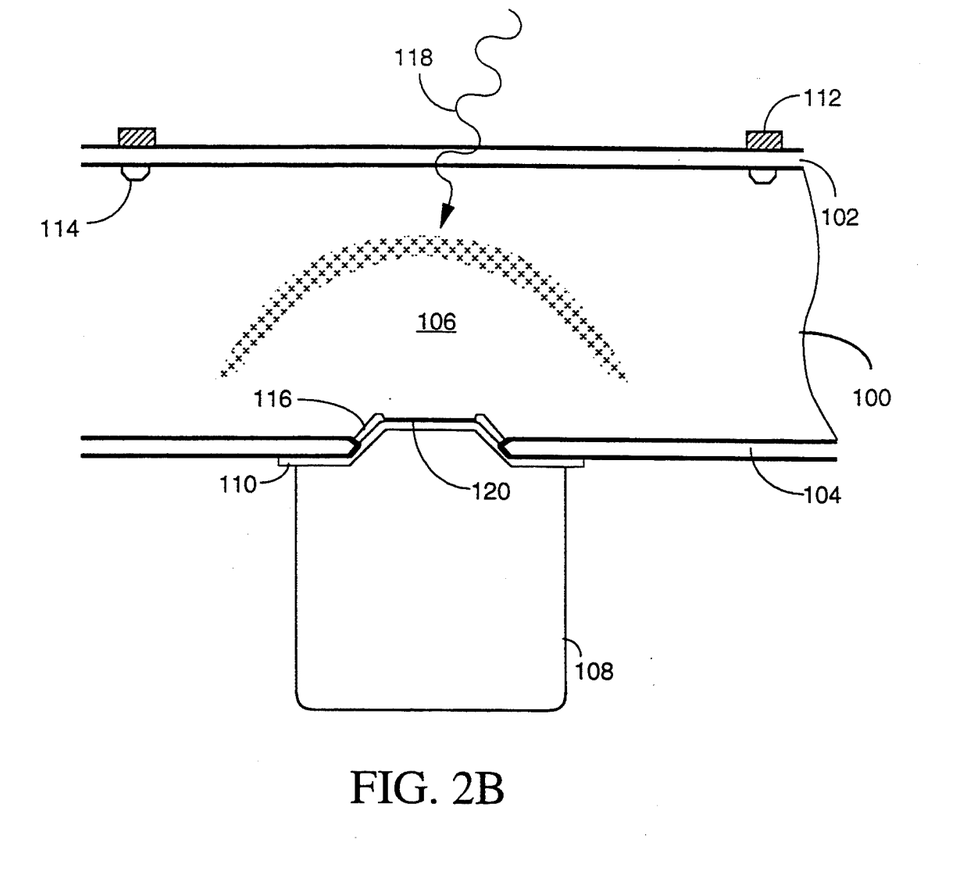
FIG. 2B is a magnified cross-section of a photo-site cell on the avalanche device 2.
Figure 3A:
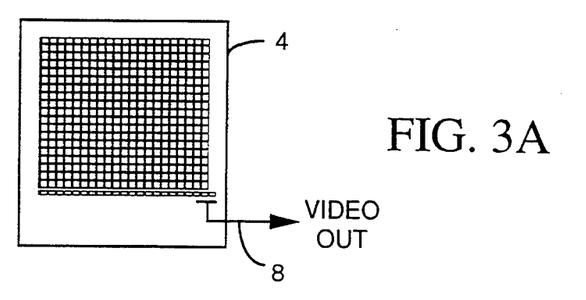
FIG. 3A is a general overview diagram of the CCD 4, the lower (optically shielded) layer of the detector 6.
Figure 3B:
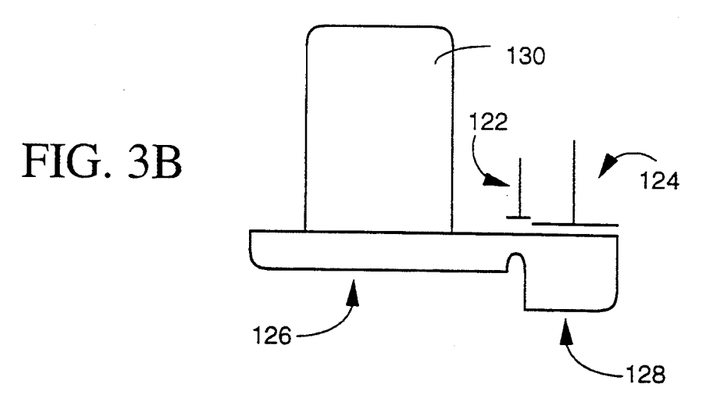
FIG. 3B is a magnified cross-section of a cell in the CCD 4.

The presently preferred embodiment begins with two separate devices which are fabricated and tested, one with the cell structure depicted in FIG. 2B and one with the cell structure as depicted in FIG. 3B. Acceptable pairs of devices are then microscopically aligned and thermally fused together with the optional addition of a thin layer of epoxy for added strength. The hybrid device, the "detector," is then tested as usual. The application of sufficiently large voltages to certain peripheral points, as will be described, will effect avalanche conditions in each cell; avalanche conditions can equally be turned off so as to effect high light level operation which may not require electron amplification; avalanche conditions can also be varied so as to effect variable amplification. Finally, device driver circuitry, output amplification, analog to digital conversion, and statistically appropriate photon counting thresholding, will produce a photon counting camera with well characterizable performance properties.

DETAILED DESCRIPTION

Figure 1:
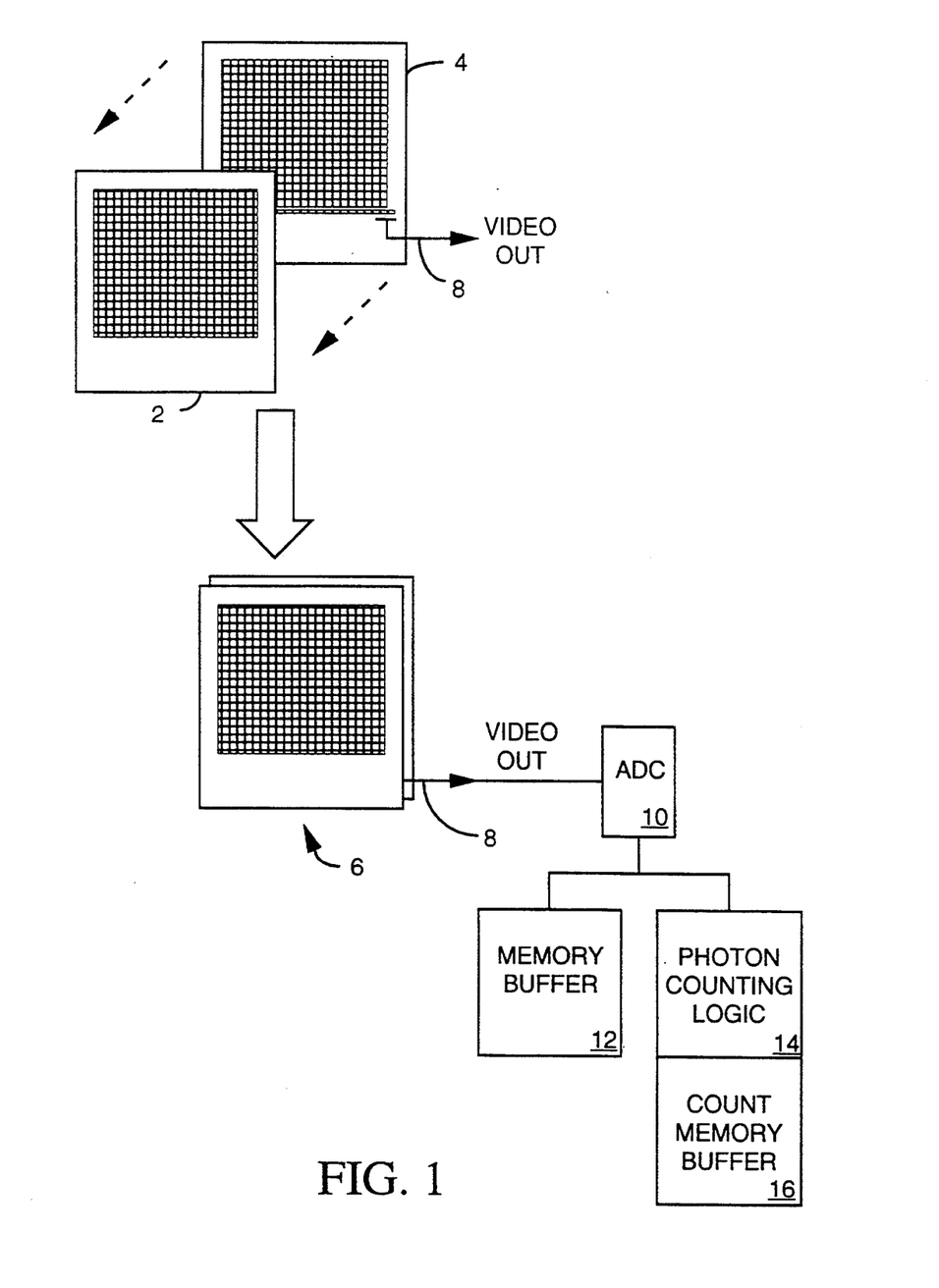
FIG. 1 is an overview of one embodiment of the present invention, highlighting the principle of mating two separately fabricated and separately optimized layers, one being a photo-sensing and amplification layer, the other being a photo-electron storage, transport, and readout layer.

FIG. 1 contains an overview of the principal components of the illustrated embodiment of the invention. It comprises two thin flat semiconductor devices, 2 and 4, joined together to form the "detector" 6. The outermost device shall be called the avalanche device 2, generally being responsible for photon detection and amplification, while the inner device will be called the CCD 4, generally being responsible for photo-electron (and avalanche electron) storage and read-out. Photo-induced charge is read out as a video signal 8 deriving from each photosite on the hybrid device, and is amplified and fed to an analog to digital converter (ADC) 10. The digital values streaming from the ADC 10 can either be directly fed into a raw memory buffer 12, or can be passed through photon counting digital logic 14 whereby the digital values are translated into best estimates of actual detected photon counts per pixel per exposure time, with these photon counts then passing into a count memory buffer 16. Those practiced in the art will understand that there are a vast array of choices and optimizations which can be made in realizing a specific design based on the general principles presented in FIG. 1.

FIG. 2A depicts the overall arrangement of photosites on one specific design of the detector 6, here shown with the front avalanche device, 2, forward. We shall henceforth assume there are 512 by 512 active photo-sites each with a nominal center to center spacing of 25 microns (giving a total active area of 12.8 mm by 12.8 mm). Note that on the avalanche device 2, there are only two peripheral leads, the ground lead 20 and the bias lead 22.

FIG. 2B now depicts a magnified cross section of a given photosite on the avalanche device 2. The incoming photon 118 orients the viewer. The bulk of the device is lightly doped p-type Silicon, 100. On top of this bulk is a shallow p+ implant layer, 102, with reference made to a lateral grid of heavy p++ annealed material, 114, and an optional lateral grid of Aluminum 112, or some such conductive material. A non-material depletion region 106 is shown, as is common in the art, referencing the ultimate application of electric fields as mediated by the various structures, as will be described henceforth. A layer of field oxide, 104, frames an inner n-type guard ring, 116, which in turn flames a very shallow and heavily doped n+-type region, 120. Below this is a thin layer of aluminum, 110, which could also be Titanium/Tungsten with another layer of Gold, among other choices as is well known in the art. Finally there is a 50-75 micron Indium bump which, as will be seen, is employed in mating to the second CCD device 6.

The avalanche device 2 is fabricated as follows. We begin with a lightly doped p-type silicon, 100, wafer, typically on the order of 500 microns thick and 4 inches in diameter, on which is grown a patterned field oxide layer 104 using the LOCOS process, as is well known in the art. The field oxide 104 essentially defines the photosite areas. This is followed by depositing the n-type guard ring 116 then followed by a heavily doped n+ type region 120. On top of all these layers either a layer of aluminum, 110 is placed via contact metalization, or possibly Titanium/Tungsten followed by Gold. At this point, the wafer is turned over and backside thinned using established techniques. This generally involves supporting the front surface with some flat, protected by photo-resist, with the backside generally thinned to a 50-100 micron thickness. Now on the newly thinned back surface the heavy p++ region 114 is implanted and thermally annealed, followed by the p+ ion implantation process to form the shallow p+ implant 102. The optional grid of aluminum or other metallic substance can then be overlaid, effecting an increase in conductivity from the periphery of the entire device to pixels near the center. The device is then flipped back around and mounted on another flat, perhaps quartz or sapphire, and the indium bump is evaporated onto the front surface directly on top of the metallic layer 110. This revisiting of the front layer is generally due to idea that the indium bump will be the most vulnerable structure and that placing it onto the device last is advisable. Those practiced in the art will easily realize that the order of operations here described, and the specific materials and structural relationships used, are all subject to normal engineering optimization, perhaps generating alternative forms which accomplish the same necessary ends. Those contained herein merely represent the best mode presently known to the inventors.

FIG. 3A shows the overall layout of the CCD layer, 4. The spacing of the cells corresponds exactly to the spacing of the photo-sites in the avalanche device 2. In many ways, this device 4 is similar to standard prior art CCD's, in particular, CCD's known as interline transfer devices. Those practiced in the art should quickly realize that one of the larger complaints surrounding interline transfer devices, generally poor effective quantum efficiency, is being obviated by separating the photo-sensing stage from the charge transport and detection stage. In this way, the simplicity and utility of the interline transfer CCD architecture can be put to better use without the usual antagonistic pressure of optimizing quantum efficiency and modulation transfer. Note also that the CCD 4 has the usual array of peripheral leads (not depicted in the drawing) and an output amplifier.

FIG. 3B now depicts a magnified cross section of a cell in the CCD 4. So as to orient the viewer, an indium bump 130 will ultimately fuse with the indium bump 108 on the avalanche device 2. Both the layout and fabrication of this device are quite similar to prior art interline transfer CCD's and thus only an inventory of the components will be given here. Reference is made to the prior publications noted above for details on how to fabricate these devices. The FIG. 3B contains a typical photo-diode, 126, connected to a CCD channel 128, with a transfer gate 122 governing the potential connection between the two. A cross section of the CCD shift gates, 124, is also shown. Finally, there is the 50-75 micron indium bump 130 which will ultimately fuse with its corresponding indium bump 108 on the avalanche device 2. Again, there are many alternative embodiments possible for this device, all of which can accomplish the basic functions of charge storage and charge transfer.

Figure 3C:
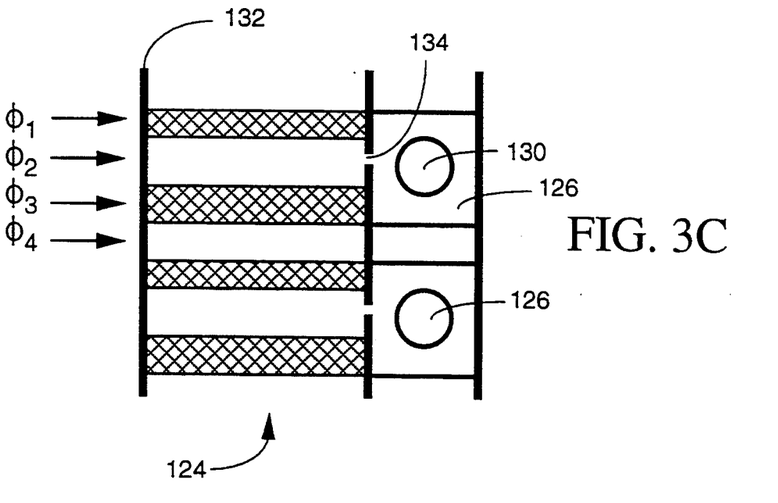
FIG. 3C is a top view of two adjacent cells in the CCD 4, using a 4-phase CCD interline transfer device as example.

FIG. 3C briefly shows a magnified top view of the interline transfer CCD device, here showing two adjacent cells along the transfer column. The indium bump 130 is also shown for reference. Note that the metallic layer 110 on the avalanche device largely shields these transfer regions from incoming optical radiation, though further provisions for shielding certainly can be used.

Normal manufacturing of the avalanche CCD detectors will no doubt involve making several devices per wafer and several wafers per run. With this in mind, it may well be economical to remove and perform basic tests on the component avalanche devices 2, and the component CCD's 4, before moving on to the fusing process. This is entirely optional, though, merely being a manner for increasing ultimate yields. The next step in creating the full hybrid detector 6 is the alignment and thermal fusing of the indium bumps, 108 and 130. Alignment can be assisted by IR microscopic techniques, whereas the actual fusing of the indium bumps is accomplished by elevating the temperature and applying pressure. Finally, an optional epoxy, or any other such material, can be injected between the two fused devices (2 and 4) in order to increase the detector 6 stability. Once the fused detector 6 is cooled, it can be mounted as is typical, pin leads attached as is typical, and tested electrically, optically, and mechanically.

Referring back to FIG. 1, the normal operation of the device is nearly identical to a standard interline transfer CCD, except that during an exposure either or both of two large voltages can be applied to 1) the bias lead on the avalanche device, or on the phase X channel on the channel gates where X is the channel opposite the transfer gate and the photo-diode 126 (the transfer gate would be held closed during the process in order to propagate the large voltage through to the n-type region 120). The voltage applied to the avalanche device bias would lead be generally around $-15$ to $-30$ V, whereas the voltage propagated by the CCD channel would be of generally equal magnitude and opposite sign. The application of specific voltages will give rise to specific avalanche conditions and concomitant (variable and selectable) gains. The two voltages do not at all need to be of equal magnitude nor possibly do both need to be present. It is anticipated that empirical measures will be used to fine tune the gain properties of each cell, in operation, and often dictated by the application at hand.

After an exposure is taken and charge accumulates in the discrete CCD channels associated with each photo-site, the transfer gates 122 are thrown high and the normal charge coupled transfer takes place, parallel transfer through transfer channels 134 and serial output transfer to an output amplifier. The analog signal from the output amplifier then typically is fed into an analog to digital converter 10. The buffering of the output of an analog to digital convertor is exceedingly common and well known in the art. A few words are in order to describe the photon counting digital logic, 14.

Apart from the utter simplicity of having a digital image represented purely by the number of detected photons per pixel per exposure time, the idea of photon counting also provides certain tools in combatting noise and in the enhancement of the statistical analysis of light distributions. This general subject is well beyond the scope of this disclosure, but suffice it to say that it is desirable to create a detection system which is generally dominated by shot noise at all light levels, while maintaining a reasonably fast frame rate (if wanted) and very high dynamic range.

Figure 4A:
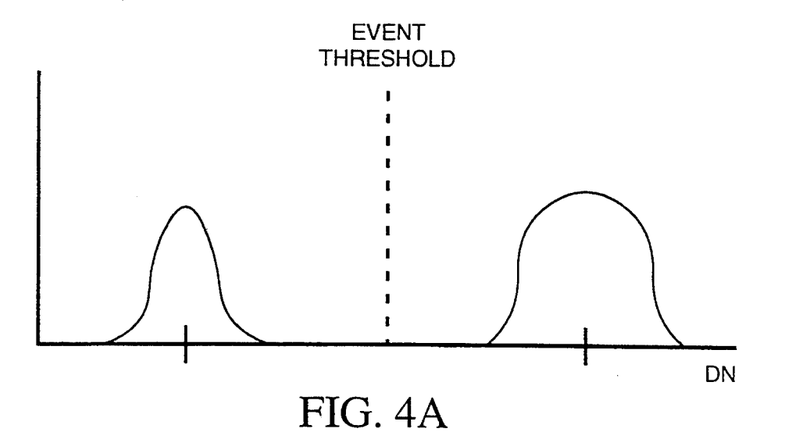
FIG. 4A is a simplified graphic attempting to illustrate the critical principles of photon counting, leading to a discussion of in operation logic.

FIG. 4A presents an simple schematic which outlines the salient issues which should be addressed by a logical network, be it implemented in hardware or in software, which translates the output digital values from the analog to digital convertor 10 into an estimated internal count of detected photons. The discussion will limit itself to the optical energy region generally referred to as the visible and near visible region wherein a single photon generally (and initially) gives rise to a single photo-electron within the photosite depletion region, 106.

FIG. 4A shows us a hypothetical statistical distribution of raw digital numbers and means (ON) emerging from the ADC 10 for N exposures for some specific photosite (n,m), first (on the left of the event threshold) when no light is falling upon the pixel, and then (on the right) when it is "known" to have detected a single photon. The quotation marks around known pay homage to the fact that it is difficult to unequivocally set up clear single photon events; thus we are looking at the situation in the abstract. Also note that the distributions would in actuality be integrally binned as opposed to the quasi-continuum of the figure; it is drawn this way merely to simplify the concepts involved. The first simple step in setting up photon counting conditions is to know these two distributions a priori, that is, prior to acquiring normal image data, and to know them for each and every photosite on the detector 6. Those practiced in the art will immediately recognize the parallel to garden variety dark framing and flat fielding (and bias framing).

Figure 4B:
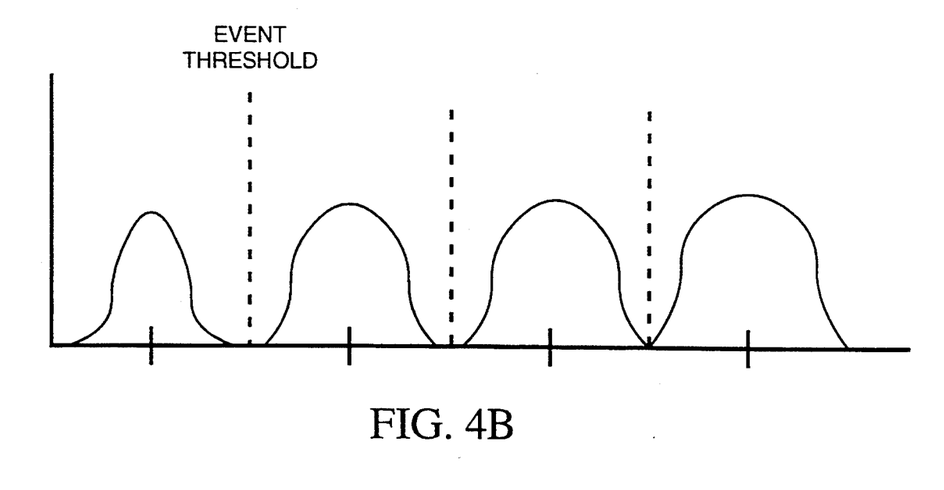
FIG. 4B expands on FIG. 4A, again with a simplified graphic showing the dynamic range properties of the detector and how it relates to mean gain and the standard deviation of gain.

FIG. 4B shows how each pixel or photosite can have its own unique "event threshold" determined (generally defined integrally as a digital number), and its own linear "gain" determined (generally defined as a fractional pixel value with a sufficient number of significant figures). The measurement of these two parameters for each and every photosite is not trivial, but neither is it complicated provided that the two distributions of FIG. 4A are indeed clearly separated. If these distributions are not cleanly separated, then the term 'photon counting' itself becomes suspect, and we are back into more classic notions of signal to noise ratios.

The "event threshold" of FIG. 4B is followed by thresholds which separate a single event from two events, two from three, and so on. For simplicity, these subsequent thresholds are drawn with a linear spacing, though they don't necessarily have to be linear; instead, they should follow the empirical characteristics of each and every photosite.

There are many potential ways to calibrate the first event threshold and subsequent thresholds. One simple approach is to optically shield and cool the detector 6 until such temperature is reached whereby approximately 1% to 5% of the photo-sites produce a single thermal event (amplified thermal electron, i.e., an electron spontaneously generated in the depletion and amplification region) in a given exposure time t. The resultant digital numbers deriving from multiple frames will bifurcate (provided the gain properties are in the true "photon counting regime") into a large "no-event" distribution and a small but appreciable "single event" distribution for each and every pixel (as well as even smaller multiple event distributions). A rough threshold can then be found simply by taking the midpoint between the two peaks, or of course more sophisticated analyses can be performed. A nominal and rough linear gain will also be found from the peak to peak spacing. Those practiced in the art will understand that this is but one of dozens of potential methods for determining the optimal thresholds, including those that employ optical input signal.

Having discussed in a general way the distributions deriving from photo-electron amplification in FIGS. 4A and 4B, it can be better appreciated that these characteristics may need to be changed during operation of the detector, or may wish to be optimized in the design of the detector. Specifically, the statistical distribution of gain should be made as small as possible (obviously). Likewise, the mean gain does not need to be overdone, so that a large dynamic range can be effected. Those knowledgeable in the use of avalanche diode principles understand that varying the voltages on either the bias 22 or the channel gate 124 opposite the transfer gate 130 will produce varying results as reflected in the graphs of FIGS. 4A and 4B. The inventors' opinion of where many normal improvements to the preferred embodiment will occur is precisely in this arena, whereby design and process improvements gradually increase the ratio of mean gain to the standard deviation of single-event gain about the mean gain; and the quest of optimizing this ratio across a wide range of optical wavelengths. This is at the heart of what is meant by the "inherently low noise gain" of wafer-scale amplification.

The photolithography dimensions utilized in fabricating detectors according to the present invention are obviously highly application dependent. However, whereas prior art CCDs have generally been limited to pixel dimensions on the order of 9 microns and larger, this dimension has previously been constrained as much by sensitivity considerations as by any absolute limit on fabrication technology. It is envisioned that detectors according to the present invention will instead be produced with pixels sizes primarily determined by fabrication constraints rather than sensitivity, thus affording opportunities for greatly enhanced CCD resolution. (Present fabrication technologies, for example, offer the promise of a many-fold reduction in pixel dimensions, with the expectation that further improvements will be made as fabrication techniques progress.)

The incorporation of an electronic detector into a camera apparatus is a matter familiar to those of ordinary skill in the art. Exemplary arrangements, applications, and assembly details are shown for example, in U.S. Pat. Nos. 5,262,867, 5,251,037, 5,221,964, 5,216,250, 5,182,647, 5,168,528, 5,138,458, 5,065,029, 4,875,100, 4,868,855, 4,851,914, 4,827,346, 4,704,632, 4,691,253, 4,663,656, and 4,629,295, the disclosures of which are incorporated herein by reference.

Conclusion

This disclosure has presented a detailed design for an avalanche CCD and its supporting camera system. It should be evident to those practiced in the art that there are many choices available in realizing the basic principles involved. The history of wafer-scale detectors has clearly shown that much art can be applied to optimization of particular elements of a design, while still operating within the basic larger framework of some given design philosophy and general architecture. We have presented what we find to be a preferred embodiment which already must make certain assumptions about cost versus performance. Other methods of fusing an avalanche device onto prior art devices have been looked at, and indeed, appear to be excellent candidates for an avalanche array detector as well. These include frame transfer CCD's, full frame CCD's, X-Y addressed devices (similar to those mentioned in the above-referenced articles, only our approach involves, once again, a fusing of two separately fabricated devices for better optimization), MOSFET devices, and CID devices, to name several. We have chosen the interline transfer CCD as our preferred embodiment because of its low output noise and the longer term potential for near 100% active exposing time.

With this clear breadth of options available in realizing a particular embodiment of the invention, we claim as our invention all such embodiments as may come within the scope and spirit of the following claims and equivalents thereto.

We claim:

1. A photodetector comprising:

a photosensing layer having a front surface and a back surface and comprising a plurality of diode regions at its back surface and a means for applying a predetermined potential difference between the back surface and the front surface, whereby a photoelectron produced in the photosensing layer in response to a photon incident on the front surface thereof is accelerated toward the back surface and generates multiple electrons due to avalanche multiplication, an electron readout layer having a front surface and a back surface and comprising a plurality of diode regions at its front surface and a means for reading out charge from the diode regions, and a coupling layer between the photosensing layer and the electron readout layer, whereby the photosensing layer is physically bonded to the electron readout layer with the back surface of the photosensing layer confronting the front surface of the electron readout layer and the diode regions of the photosensing layer are electrically connected to respective diode regions of the electron readout layer.

2. A photodetector according to claim 1, wherein the coupling layer comprises a plurality of discrete metal bodies each having first and second opposite sides, each metal body being bonded at its first side to a diode region of the photosensing layer and at its second side to a diode region of the electron readout layer.

3. A photodetector according to claim 2, wherein the coupling layer further comprises adhesive material interspersed among the bodies of metal.

4. A photodetector according to claim 1, wherein the electron readout layer comprises an interline transfer charge-coupled device.

5. A photodetector according to claim 1, wherein the photosensing layer comprises a layer of silicon having a thickness in the range from 50 $\mu$m to 100 $\mu$m.

6. A photodetector comprising:

a photosensing layer having a front surface and a back surface and comprising at least one row of diode regions at its back surface, an interline transfer charge-coupled device having a front surface and a back surface and comprising at least one row of diode regions at its front surface, whereby for each diode region of the photosensing layer there is a corresponding diode region of the electron readout layer, the interline transfer charge-coupled device further comprising a CCD channel extending adjacent the row of diode regions, whereby a segment of the CCD channel is associated with each diode region of the row, a transfer gate associated with each diode region of the row for controlling introduction of a charge packet from a diode region of the row into the associated segment of the CCD channel, the transfer gate having an on state and an off state, and a plurality of CCD channel phase gates associated with each segment of the channel for controlling transfer of a charge packet along the CCD channel, and wherein the transfer gate associated with a given diode region of the row introduces a charge packet into the associated segment of the CCD channel beneath the channel phase gate associated with that segment, a coupling layer between the photosensing layer and the interline transfer charge-coupled device, whereby the photosensing layer is physically bonded to the interline transfer charge-coupled device with the back surface of the photosensing layer confronting the front surface of the interline transfer charge-coupled device and the diode regions of the photosensing layer are electrically connected respectively to the corresponding diode regions of the interline transfer charge-coupled device, and a means for applying a predetermined potential difference between the front surface of the photosensing layer and the channel phase gate associated with a diode region of the interline transfer charge-coupled device when the associated transfer gate is in the on state, whereby potential applied to the channel phase gate is propagated to the corresponding diode region of the photosensing layer, the potential difference being such that a photoelectron produced in the photosensing layer in response to a photon incident on the front surface thereof is accelerated toward the back surface and generates multiple electrons due to avalanche multiplication.

7. A photodetector comprising:

a photosensing layer having a front surface and a back surface and comprising an array of diode regions at its back surface in a predetermined pattern and a means for applying a predetermined potential difference between the back surface and the front surface, whereby a photoelectron produced in the photosensing layer in response to a photon incident on the front surface is accelerated toward the back surface and generates multiple electrons due to avalanche multiplication, an electron readout layer having a front surface and a back surface and comprising an array of diode regions at its front surface in a pattern corresponding to said predetermined pattern, whereby for each diode region of the photosensing layer there is a corresponding diode region of the electron readout layer, and a means for reading out charge from the diode regions of the electron readout layer, and a coupling layer between the photosensing layer and the electron readout layer, whereby the photosensing layer is physically bonded to the electron readout layer with the back surface of the photosensing layer confronting the front surface of the electron readout layer and the diode regions of the photosensing layer are electrically connected respectively to the corresponding diode regions of the electron readout layer.

8. A photodetector according to claim 7, wherein the array of diode regions of the photosensing layer is a rectangular array.

9. A photodetector according to claim 7, wherein the coupling layer comprises an array of metal bodies in a pattern corresponding to said predetermined pattern, each metal body having a first face whereby the body is bonded to the photosensing layer and a second face, opposite the first face, whereby the metal body is bonded to the electron readout layer.

10. A photodetector comprising:

a photosensing layer having a front surface and a back surface and comprising at least one row of diode regions at its back surface, an interline transfer charge-coupled device having a front surface and a back surface and comprising at least one row of diode regions at its front surface, whereby for each diode region of the photosensing layer there is a corresponding diode region of the electron readout layer, the interline transfer charge-coupled device further comprising a CCD channel extending adjacent the row of diode regions thereof, whereby a segment of the CCD channel is associated with each diode region of the row, a transfer gate associated with each diode region of the row for controlling introduction of a charge packet from a diode region of the row into the associated segment of the CCD channel, the transfer gate having an on state and an off state, and a plurality of CCD channel phase gates associated with each segment of the channel for controlling transfer of a charge packet along the CCD channel, and wherein the transfer gate associated with a given diode region of the row introduces a charge packet into the associated segment of the CCD channel beneath the channel phase gate associated with that segment, a coupling layer between the photosensing layer and the interline transfer charge-coupled device, whereby the photosensing layer is physically bonded to the interline transfer charge-coupled device with the back surface of the photosensing layer confronting the front surface of the interline transfer charge-coupled device and the diode regions of the photosensing layer are electrically connected respectively to the corresponding diode regions of the interline transfer charge-coupled device, and a means for applying a predetermined potential difference between the front surface of the photosensing layer and the channel phase gate associated with a diode region of the interline transfer charge-coupled device when the associated transfer gate is in the on state, whereby potential applied to the channel phase gate is propagated to the corresponding diode region of the photosensing layer, the potential difference being such that a photoelectron produced in the photosensing layer in response to a photon incident on the front surface thereof is accelerated toward the back surface and generates multiple electrons due to avalanche multiplication 11. A method of operating a photodetector that comprises a photosensing layer comprising an array of diode regions at a back surface thereof in a predetermined pattern, and an electron readout layer comprising an array of diode regions at a front surface thereof in a pattern corresponding to said predetermined pattern, whereby for each diode region of the photosensing layer there is a corresponding diode region of the electron readout layer, and a readout electrode structure at the front surface of the electron readout layer for reading out charge from the diode regions of the electron readout layer, and the photodetector further comprising a coupling layer between the photosensing layer and the electron readout layer, whereby the photosensing layer is physically bonded to the electron readout layer with the back surface of the photosensing layer confronting the front surface of the electron readout layer and the diode regions of the photosensing layer are electrically connected respectively to the corresponding diode regions of the electron readout layer, said method comprising:

applying a predetermined potential difference between a front surface of the photosensing layer and the readout electrode structure, whereby a photoelectron produced in the photosensing layer in response to a photon incident on the front surface is accelerated toward the back surface and generates multiple electrons due to avalanche multiplication, and reading out electrons from the diode regions of the electron readout layer through the readout electrode structure.

12. A method according to claim 11, wherein the electron readout layer comprises an interline transfer charge-coupled device and the interline transfer charge-coupled device comprises at least one row of diode regions, a CCD channel extending adjacent the row of diode regions, whereby a segment of the CCD channel is associated with each diode region of the row, a transfer gate associated with each diode region of the row for controlling introduction of a charge packet from a diode region of the row into the associated segment of the CCD channel, the transfer gate having an on state and an off state, and a plurality of CCD channel phase gates associated with each segment of the channel for controlling transfer of a charge packet along the CCD channel, and wherein the transfer gate associated with a given diode region of the row introduces a charge packet into the associated segment of the CCD channel beneath the channel phase gate associated with that segment, and the method comprises:

placing the transfer gate associated with a selected diode region of the row in the on state, applying a voltage to the channel phase gate associated with the selected diode region of the row, whereby the voltage is propagated to the corresponding diode region of the photosensing layer to establish conditions in which avalanche multiplication can occur, and subsequently placing the transfer gate in the off state and employing the phase gates to read out charge through the CCD channel.

* * * * *